(12) United States Patent
Chiang et al.

(10) Patent No.: US 10,396,018 B2
(45) Date of Patent: Aug. 27, 2019

(54) MULTI-PHASE HALF BRIDGE DRIVER PACKAGE AND METHODS OF MANUFACTURE

(71) Applicant: Infineon Technologies AG, Neubiberg (DE)

(72) Inventors: Chau Fatt Chiang, Melaka (MY); Chan Lam Cha, Melaka (MY); Wei Han Koo, Melaka (MY); Andreas Kucher, Villach (AT); Theng Chao Long, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/822,745

(22) Filed: Nov. 27, 2017

(65) Prior Publication Data

US 2019/0164873 A1    May 30, 2019

(51) Int. Cl.
| | |
|---|---|
| *H01L 23/52* | (2006.01) |
| *H01L 21/60* | (2006.01) |
| *H01L 23/495* | (2006.01) |
| *H03K 17/687* | (2006.01) |
| *H01L 23/31* | (2006.01) |
| *H01L 21/48* | (2006.01) |
| *H01L 21/56* | (2006.01) |
| *H02M 1/088* | (2006.01) |
| *H02P 27/04* | (2016.01) |

(52) U.S. Cl.
CPC .... *H01L 23/49575* (2013.01); *H01L 21/4803* (2013.01); *H01L 21/4825* (2013.01); *H01L 21/565* (2013.01); *H01L 23/3114* (2013.01); *H01L 23/4951* (2013.01); *H01L 23/4952* (2013.01); *H01L 23/49537* (2013.01); *H01L 23/49562* (2013.01); *H01L 23/49568* (2013.01); *H03K 17/6871* (2013.01); *H02M 1/088* (2013.01); *H02P 27/04* (2013.01)

(58) Field of Classification Search
CPC .............................. H01L 23/52; H01L 21/60
USPC ......................................... 257/777; 438/109
See application file for complete search history.

(56) References Cited

U.S. PATENT DOCUMENTS

2002/0117764 A1* 8/2002 Huang ................ H01L 23/4334
                                                                257/796
2013/0113114 A1* 5/2013 Hosseini ........... H01L 23/49551
                                                                257/777

(Continued)

*Primary Examiner* — Sheng-Bai Zhu
(74) *Attorney, Agent, or Firm* — Murphy, Bilak & Homiller, PLLC

(57) ABSTRACT

A semiconductor package includes a plurality of half bridge assemblies each including a metal lead, a first power transistor die attached to a first side of the metal lead, and a second power transistor die disposed under the first power transistor die and attached to a second side of the metal lead opposite the first side. Each metal lead has a notch which exposes one or more bond pads at a side of the second power transistor die attached to the metal lead. The semiconductor package also includes a controller die configured to control the power transistor dies. Each power transistor die, each metal lead and the controller die are embedded in a mold compound. Bond wire connections are provided between the controller die and the one or more bond pads at the side of each second power transistor die exposed by the notch in the corresponding metal lead.

13 Claims, 10 Drawing Sheets

(56) References Cited

U.S. PATENT DOCUMENTS

| | | | |
|---|---|---|---|
| 2013/0256856 A1* | 10/2013 | Mahler | H01L 21/76816 257/676 |
| 2014/0035112 A1* | 2/2014 | Kadoguchi | H01L 23/49548 257/666 |
| 2014/0264819 A1* | 9/2014 | Okumura | H01L 23/3672 257/712 |
| 2016/0322969 A1* | 11/2016 | Padmanabhan | H01L 29/747 |

* cited by examiner

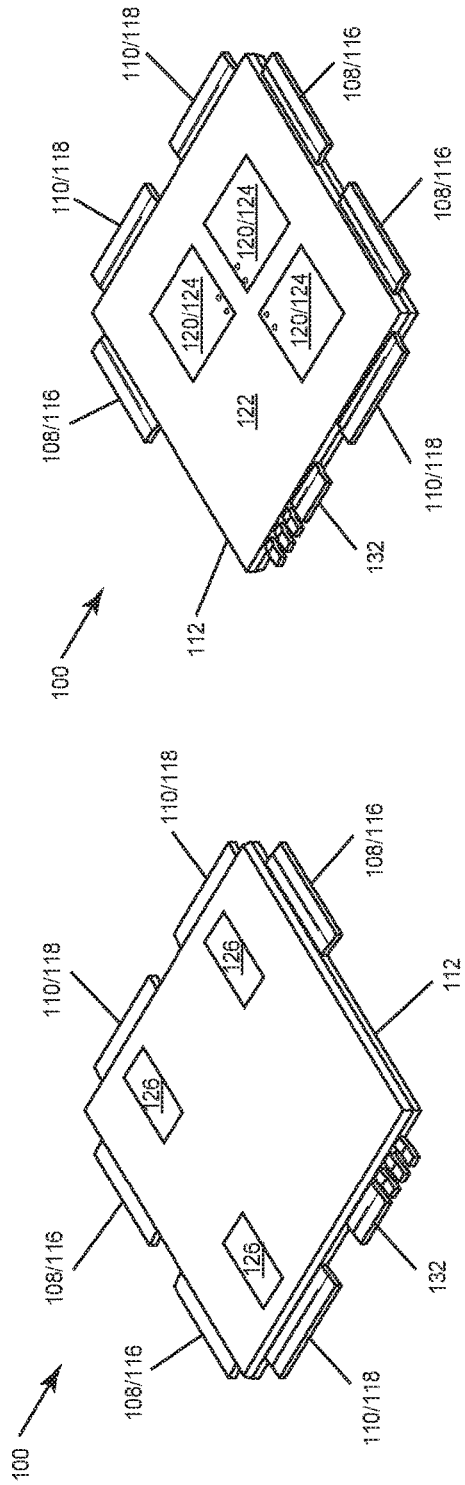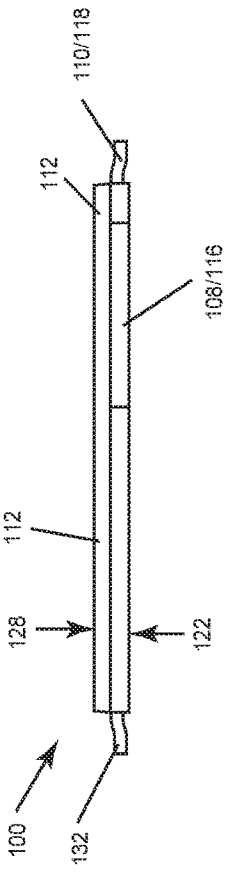

MULTI-PHASE HALF BRIDGE DRIVER PACKAGE AND METHODS OF MANUFACTURE

BACKGROUND

The integration of multiple power transistors and a microcontroller in a small and thin package presents several challenges. For example, multi-phase brushless DC motors require high current (e.g. between 70 A to 120 A), operate at high temperature (e.g. above 150° C.), and consume significant power (e.g. up to 500 W). A half bridge driver for such an application generates significant heat that must be dissipated by the package. Conventional multi-phase half bridge drivers are implemented by attaching the half bridge power transistor dies and the corresponding controller die to a printed circuit board (PCB). Such a solution has a large footprint and provides no built-in cooling features. Such a conventional board-based implementation of a multi-phase half bridge driver also suffers from voltage spikes and higher levels of EMI (electromagnetic interference), due to high inductance connections between the dies and the board.

Hence, there is a need for an improved multi-phase half bridge driver package solution having a smaller footprint, better heat dissipation characteristics and lower inductance.

SUMMARY

According to an embodiment of a semiconductor package, the semiconductor package comprises: a plurality of half bridges each comprising a first power transistor die disposed over a second power transistor die; a separate first metal lead attached to a bottom side of the first power transistor die and to a top side of the second power transistor die of each half bridge; a separate or single second metal lead attached to a top side of the first power transistor die of each half bridge; and a mold compound in which each half bridge and each metal lead is embedded. Each first metal lead protrudes from a side face of the mold compound to form a half bridge output terminal. Each second metal lead protrudes from a side face of the mold compound to form a first half bridge power terminal. At least part of a bottom side of the second power transistor die of each half bridge is not covered by the mold compound at a first main face of the mold compound to form a second half bridge power terminal. At least part of each second metal lead is not covered by the mold compound at a second main face of the mold compound opposite the first main face.

According to another embodiment of a semiconductor package, the semiconductor package comprises a plurality of half bridge assemblies each comprising a metal lead, a first power transistor die attached to a first side of the metal lead, and a second power transistor die disposed under the first power transistor die and attached to a second side of the metal lead opposite the first side. Each metal lead has a notch which exposes one or more bond pads at a side of the second power transistor die attached to the metal lead. The semiconductor package further comprises: a controller die configured to control the first power transistor dies and the second power transistor dies; a mold compound in which each power transistor die, each metal lead and the controller die are embedded; and bond wire connections between the controller die and the one or more bond pads at the side of each second power transistor die exposed by the notch in the corresponding metal lead.

According to an embodiment of a method of manufacturing a semiconductor package, the method comprises: attaching a separate first power transistor die to a first side of a plurality of first metal leads; attaching a separate second power transistor die to a second side of each first metal lead, so that each first power transistor die is disposed over one of the second power transistor dies and electrically coupled to the second power transistor die to form a half bridge; attaching a separate or single second metal lead to a side of each first power transistor die facing away from the plurality of first metal leads; and embedding each power transistor die and each metal lead in a mold compound. Each first metal lead protrudes from a side face of the mold compound to form a half bridge output terminal. Each second metal lead protrudes from a side face of the mold compound to form a first half bridge power terminal. At least part of a side of each second power transistor die facing away from the plurality of first metal leads is not covered by the mold compound at a first main face of the mold compound to form a second half bridge power terminal. At least part of each second metal lead is not covered by the mold compound at a second main face of the mold compound opposite the first main face.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates a top perspective view of an embodiment of a multi-phase half bridge driver package.

FIG. 1B illustrates a bottom perspective view of the multi-phase half bridge driver package.

FIG. 1C illustrates a side perspective view of the multi-phase half bridge driver package.

DETAILED DESCRIPTION

Embodiments described herein provide an integrated package solution for multi-phase half bridge drivers that has a small footprint, good heat dissipation characteristics and low inductance compared to board-based solutions. The integrated package solution described herein also has reduced voltage spikes and less EMI, due to lower inductance connections to the package. Also, the integrated package solution yields a system-level cost savings due to reduced input filtering requirements.

FIG. 1A illustrates a top perspective view of an embodiment of a multi-phase half bridge driver package 100.

FIG. 1B illustrates a bottom perspective view of the multi-phase half bridge driver package 100.

FIG. 1C illustrates a side perspective view of the multi-phase half bridge driver package 100.

Figure 1D:
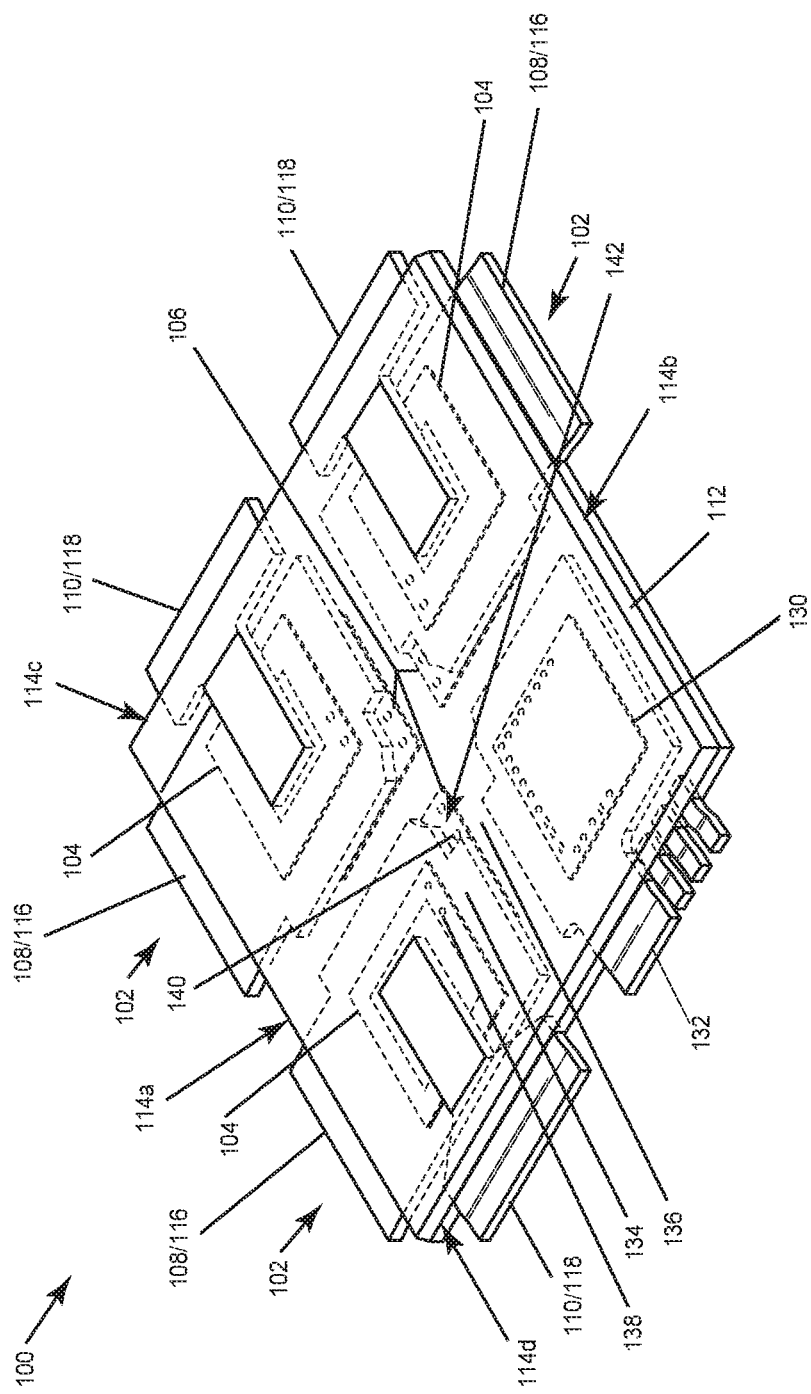
FIG. 1D illustrates the same top perspective view in FIG. 1A, but with the mold compound removed in certain areas to show interior components of the package.

FIG. 1D illustrates the same top perspective view in FIG. 1A, but with the mold compound removed in certain areas to show interior components of the package 100.

The multi-phase half bridge driver package 100 includes a plurality of half bridges 102. Each half bridge 102 forms a phase of the driver, and includes a first power transistor die 104 disposed over a second power transistor die 106 and electrically coupled to one another at a switch node. In one embodiment, the first power transistor dies 104 are low-side power transistor dies and the second power transistor dies 106 are high-side power transistor dies. In other embodiments, the die stacking is reversed so that the high-side power transistor dies are on top and the low-side power transistor dies are on the bottom. The terms 'top' and 'bottom' refer to orientations within the package. The power transistor dies 104, 106 can include any standard type of power transistor switch typically used in half bridges, such as but not limited to power MOSFETs (metal oxide semiconductor field effect transistors), IGBTs (insulated gate bipolar transistors), HEMTs (high electron mobility transistors), etc.

A separate first metal lead 108 is attached to the bottom side of the first power transistor die 104 and to the top side of the second power transistor die 106 of each half bridge 102, and a separate second metal lead 110 is attached to the top side of the first power transistor die 104 of each half bridge 102 to form respective half bridge assemblies. Each half bridge assembly includes a pair of first and second power transistor dies 104/106, a first metal lead 108 connected between the dies 104, 106 at the corresponding switch node, and a second metal lead 110 attached to the top side of the first (upper) power transistor die 104. Each half bridge 102 and each metal lead 108, 110 are embedded in a mold compound 112. Any standard mold compound can be used.

Each first metal lead 108 protrudes from a side face 114 of the mold compound 112 to form a half bridge output terminal 116 which is coupled to the switch node of the corresponding half bridge 102. Each second metal lead 110 protrudes from a side face 114 of the mold compound 112 to form a first half bridge power terminal 118. At least part of the bottom side 120 of the second power transistor die 106 of each half bridge 102 is not covered by the mold compound 112 at the bottom main face 122 of the mold compound 112 to form a second half bridge power terminal 124. In the case of low-side power transistors being disposed over the high-side power transistors, each second metal lead 110 protrudes from a side face 114 of the mold compound 112 to form a ground terminal 118 for the respective half bridge 102 and the part 120 of the bottom side of each second power transistor die 106 not covered by the mold compound 112 at the bottom main face 122 of the mold compound 112 forms a voltage terminal 124 for the respective half bridge 102. At least part 126 of each second metal lead 110 is not covered by the mold compound 112 at the top main face 128 of the mold compound 112 opposite the bottom main face 122, to enable double-sided cooling of the multi-phase half bridge driver package 100.

In one embodiment, the part 120 of the bottom side of each second power transistor die 106 not covered by the mold compound 112 has bare semiconductor material exposed at the bottom main face 122 of the mold compound 112. According to this embodiment, the drain/collector terminal 124 of the respective half bridges 102 at the bottom main face 122 of the mold compound 112 can be directly attached to a board (not shown) such as a PCB, e.g. using solder, an electrically conductive adhesive, etc. for better heat dissipation. In another embodiment, a metal lead (not shown) can be attached to the part 120 of the bottom side of each second power transistor die 106 not covered by the mold compound 112 at the bottom main face 122 of the mold compound 112. According to this embodiment, and instead of a direct semiconductor attachment to the board, these additional leads at the bottom main face 122 of the mold compound 112 are attached to the board.

According to the embodiment illustrated in FIGS. 1A through 1D, three half bridges 102 are embedded in the mold compound 112, two first metal leads 108 protrude from a first side face 114a of the mold compound 112, and a single first metal lead 108 protrudes from a second side face 114b of the mold compound 112 opposite the first side face 114a. Also, two second metal leads 110 protrude from a third side face 114c of the mold compound 112 in two locations and a single second metal lead 110 protrudes from a fourth side face 114d of the mold compound 112 opposite the third side face 114c in a single location. Hence, the embodiment shown in FIGS. 1A through 1D is a 3-phase half bridge driver package which can be used in various applications, such as a driver for a 3-phase brushless DC motor, a driver for a 3-phase power converter driver, etc. In general, the multi-phase half bridge driver package 100 has two or more phases 102. Each phase 102 is realized by a stacked half bridge assembly e.g. of the kind shown in FIGS. 1A through 1D.

In addition to the half bridge assemblies described above, the multi-phase half bridge driver package 100 can also include a controller die 130 embedded in the mold compound 112 for controlling the plurality of half bridges 102. Alternatively, the controller die 130 can be provided in a separate package. If integrated into the same package as the half bridge assemblies, the controller die 130 can be attached to an additional lead 132 separate from the leads 108, 110 of the half bridge assemblies. Bond wire connections 134, 136 are provided between the controller die 130 and the half bridge power transistor dies 104, 106. The first power transistor dies 104 are disposed above the respective first metal leads 108. Hence, bond wire connections 134 can be readily formed to the respective control (gate) pad 138 of the respective first power transistor dies 104. One such bond wire connection 134 is shown in FIG. 1D.

The second power transistor dies 106 are disposed under the respective first metal leads 108. To implement bond wire connections 136 between the controller die 130 and the respective control (gate) pad 140 of the second power transistor dies 106 which are disposed under the respective first metal leads 108, each first metal lead 108 has a notch 142 which exposes part of the top side 144 of the corresponding second power transistor die 106. One or more bond pads 140, 146 are provided in the region of the top side 144 of each second power transistor die 106 exposed by the notch 142 in the corresponding first metal lead 108. For example, one bond pad 140 is for a control (gate) connection to the respective second power transistor dies 106. At least one additional bond pad 146 can be provided in the region of the top side 144 of each second power transistor die 106 exposed by the notch 142 in the corresponding first metal lead 108, for example to provide a source sense connection between each second power transistor die 106 and the controller die 130. Still additional bond pads can be provided in the region of the top side 144 of each second power transistor die 106 exposed by the notch 142 in the corresponding first metal lead 108, depending on the type of second power transistor die 106 used. In each case, bond wire connections 136 are provided between the controller die 130 and the one or more bond pads 140, 146 at the top side 144 of each second power transistor die 106 exposed by the notch 142 in the corresponding first metal lead 108. One such bond wire connection 136 is shown in FIG. 1D.

Figure 2:
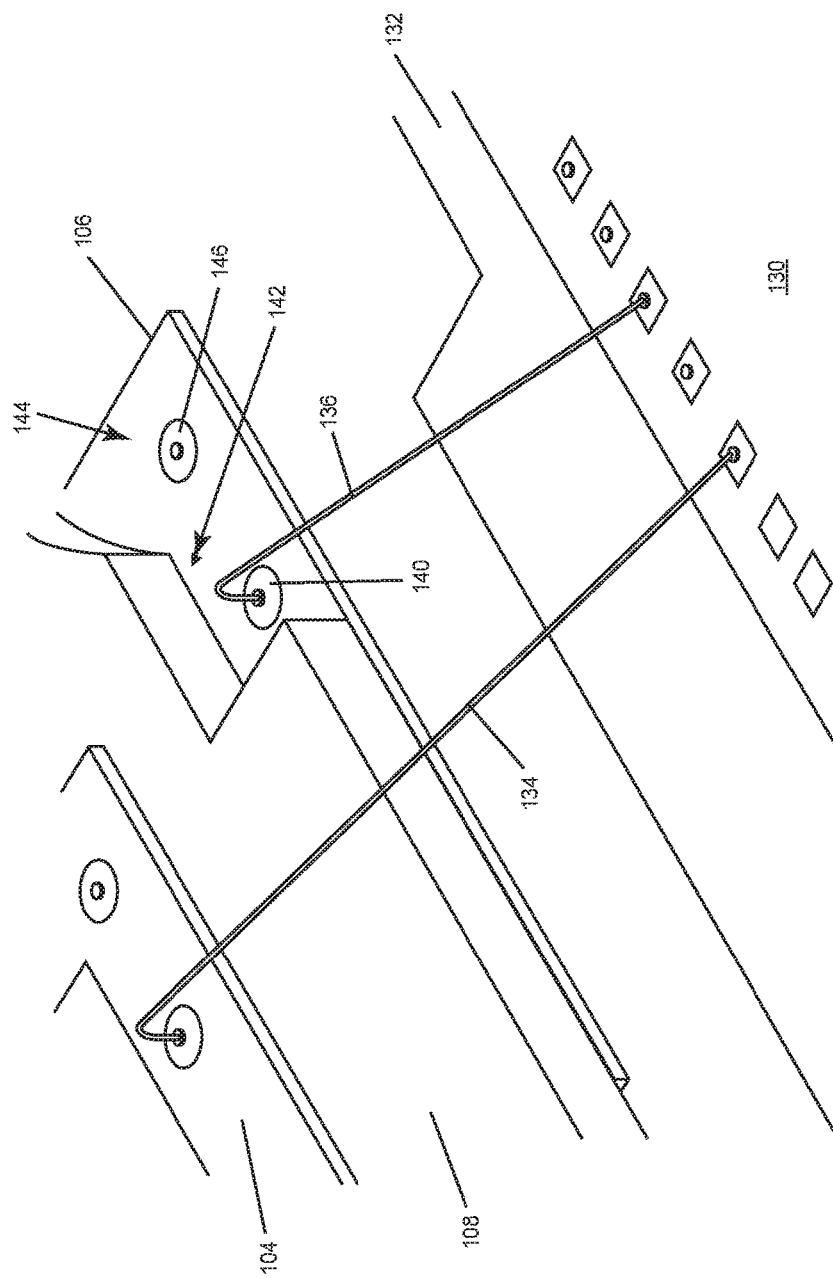
FIG. 2 illustrates an exploded view of bond wire connections between a controller die and two different power transistor dies within the package.

FIG. 2 shows an exploded view of this bond wire connection 136, and the control (gate) bond wire connection 134 to the first power transistor die 104 of the same half bridge 102.

Figure 3B:
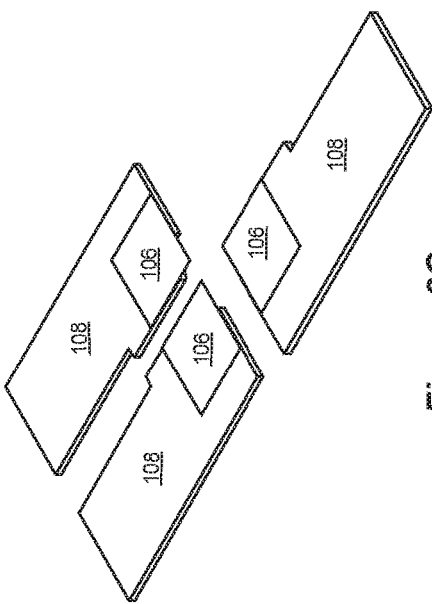
FIGS. 3A through 3C illustrate an embodiment of manufacturing the half bridge assemblies shown in FIGS. 1A through 1D.
Figure 3C:
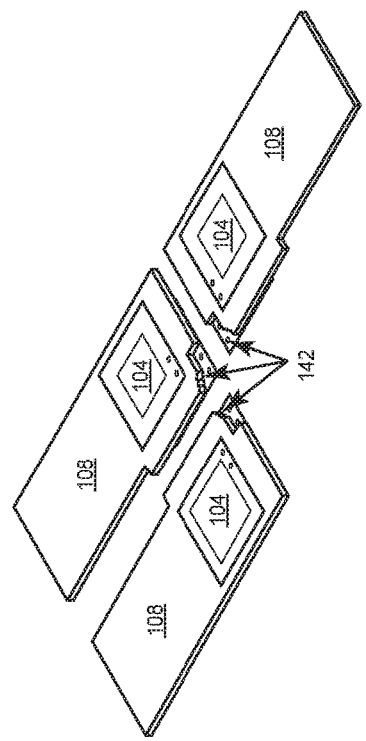
Figure 3A:
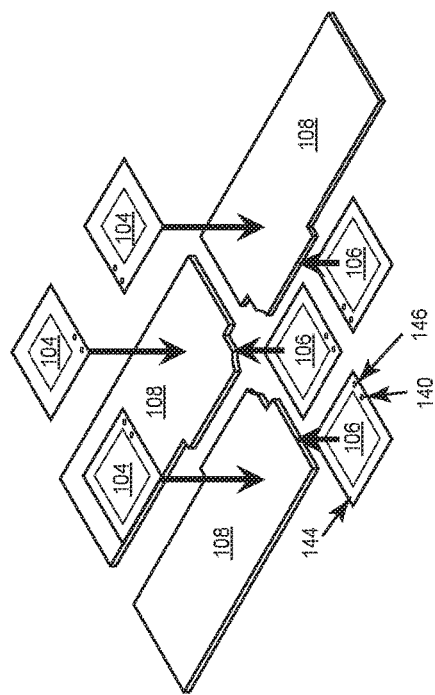

FIGS. 3A through 3C illustrate an embodiment of manufacturing the half bridge assemblies shown in FIGS. 1A through 1D.

Figures 4A, 4B:
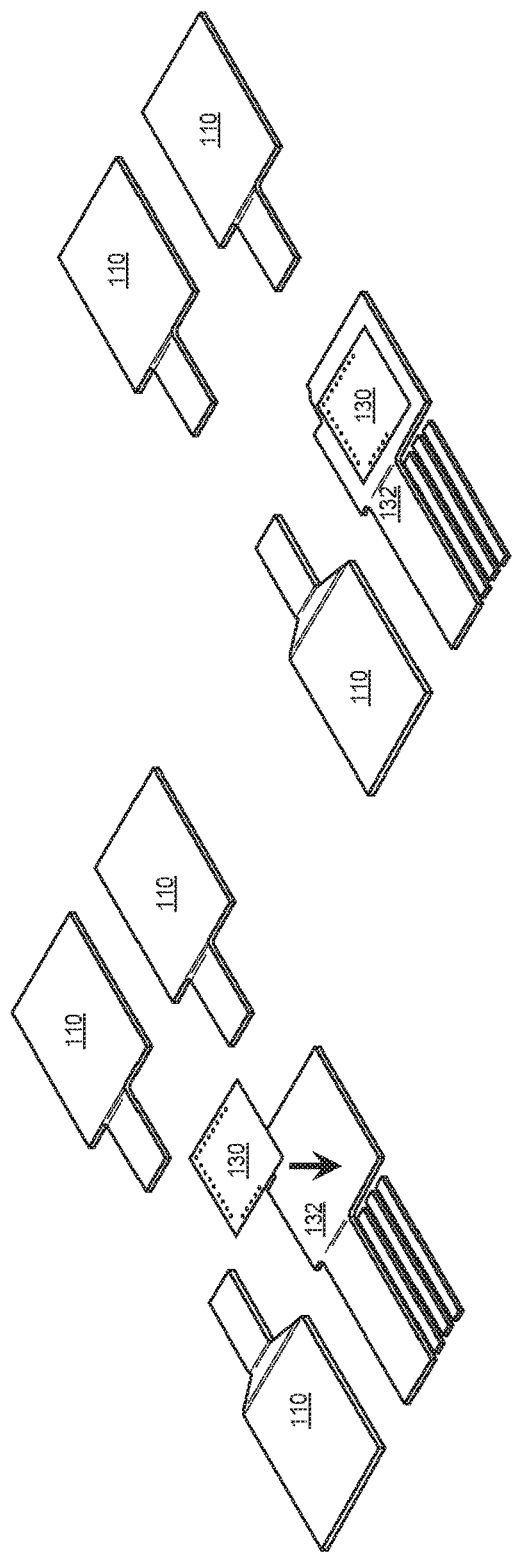
FIGS. 4A and 4B illustrate an embodiment of manufacturing the controller die assembly shown in FIGS. 1A through 1D.

FIGS. 4A and 4B illustrate an embodiment of manufacturing the controller die assembly shown in FIGS. 1A through 1D.

Figure 5A:
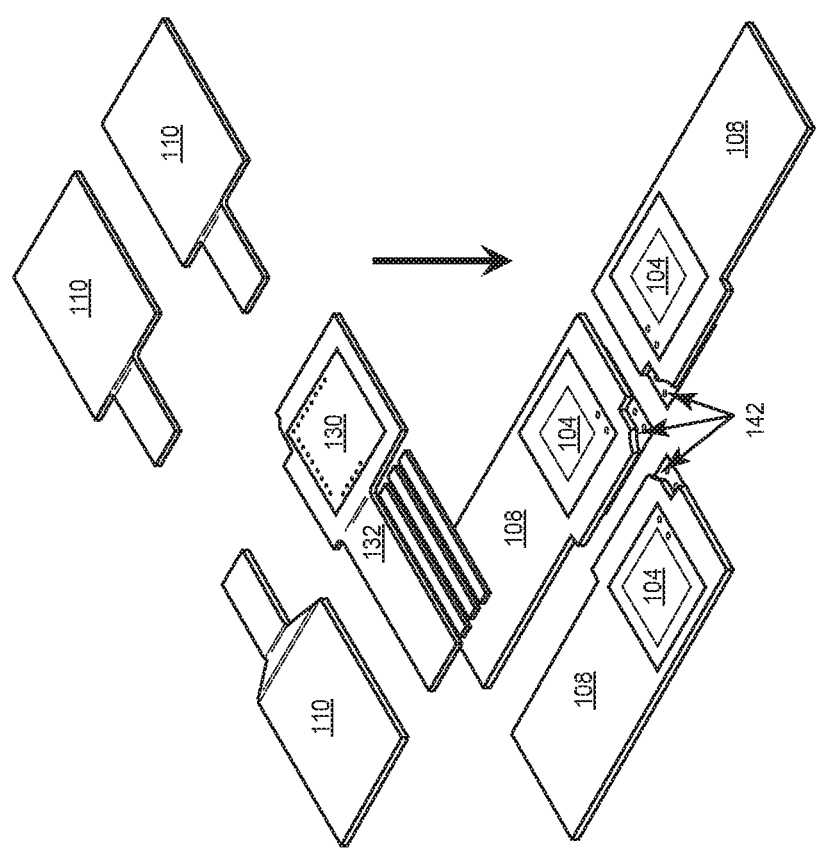
FIGS. 5A through 5C illustrate an embodiment of manufacturing the multi-phase half bridge driver package shown in FIGS. 1A through 1D, from the half bridge assemblies shown in FIGS. 3A through 3C and the controller die assembly shown in FIGS. 4A and 4B.
Figure 5B:
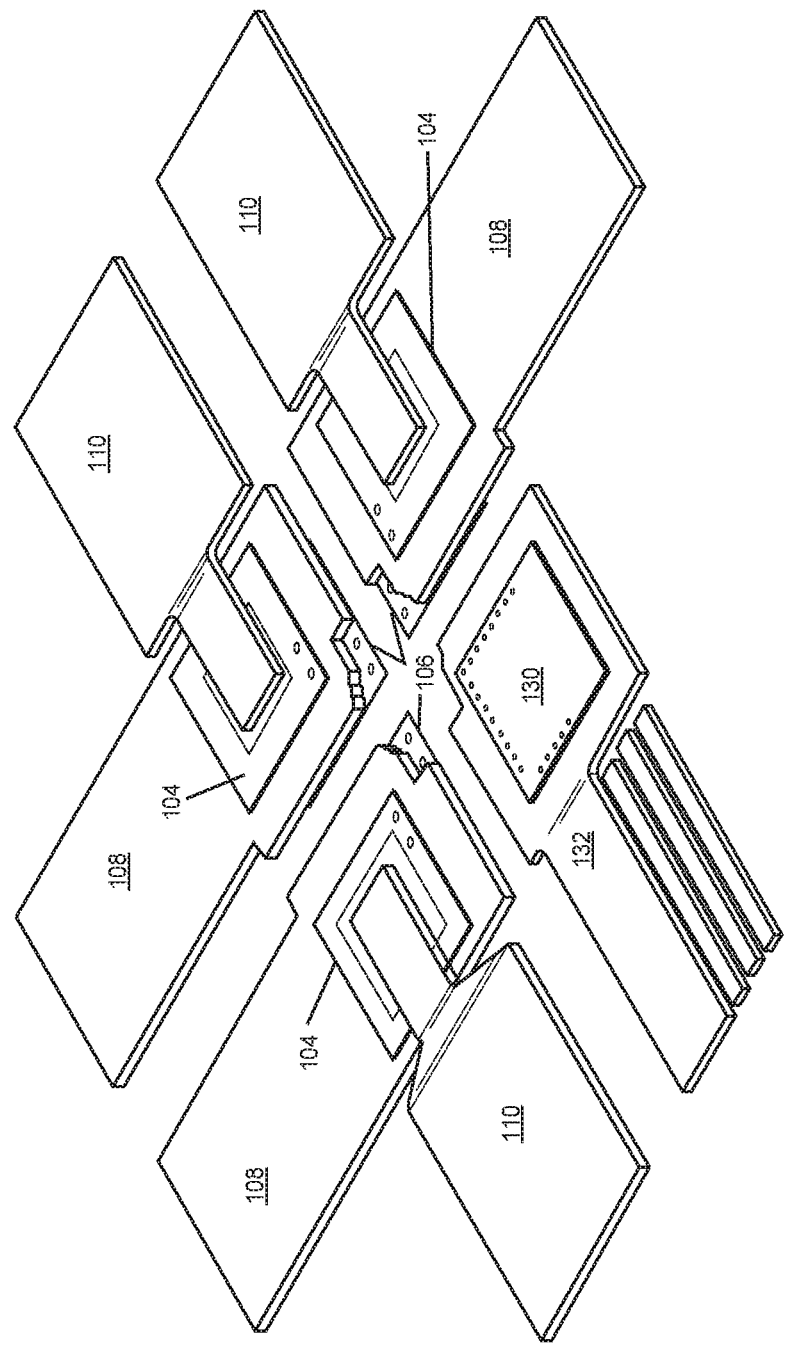
Figure 5C:
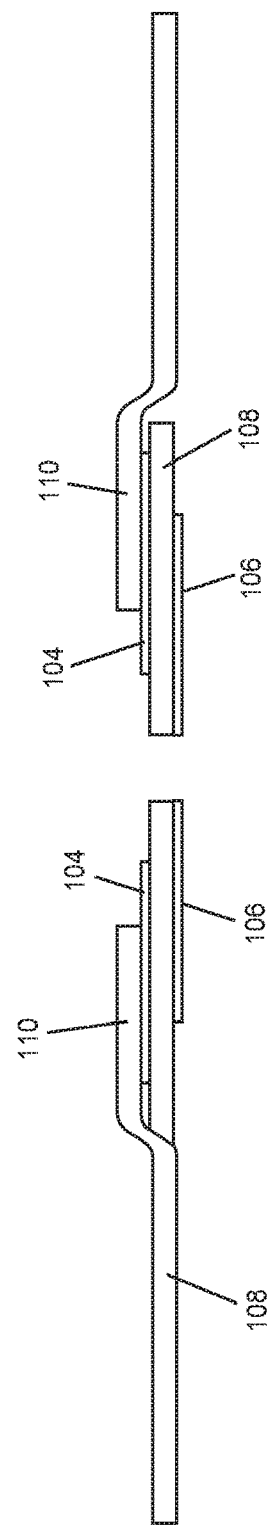

FIGS. 5A through 5C illustrate an embodiment of manufacturing the multi-phase half bridge driver package 100 shown in FIGS. 1A through 1D, from the three half bridge assemblies shown in FIGS. 3A through 3C and the controller die assembly shown in FIGS. 4A and 4B.

FIG. 3A shows the first power transistor dies 104 being aligned over the respective first metal leads 108, and the second power transistor dies 108 being aligned under the respective first metal leads 108. Several lead frame assemblies can be manufactured in parallel using standard leadframe strip processing. A standard leadframe strip includes the first metal leads 108 for a plurality of half bridge assemblies for several packages. The first metal leads 108 are interconnected to one another by a frame. Each group of first metal leads 108 associated with one package forms an individual leadframe which are interconnected by the frame e.g. via so-called tie bars or similar structures. Leadframe strips are typically constructed from flat sheet metal, e.g. by stamping or etching. The sheet metal is typically exposed to chemical etchants that remove areas not covered by photoresist. After the etching process, the etched frames are singulated (separated) into lead frame strips. Each lead frame strip includes a number of unit lead frames each having the lead construction described herein. The frame and corresponding interconnection structures (e.g. tie bars) are not shown for ease of illustration.

FIG. 3B shows the three half bridge assemblies after each pair of first and second power transistor dies 104/106 is attached to the corresponding first metal lead 108. Any standard die attach process such as soldering, sintering, gluing, etc. can be used to attach the power transistor dies 104, 106 to the respective first metal leads 108.

FIG. 3C shows a bottom perspective view of the half bridge assemblies after die attach.

As explained previously herein, each first metal lead 108 can have a notch 142 which exposes part of the top side 144 of the corresponding second power transistor die 106, and one or more bond pads 140, 146 can be provided in the region of the top side 144 of each second power transistor die 106 exposed by the notch 142 in the corresponding first metal lead 108. Such a notch/lead construction allows for easier bond wire connection to bond pad(s) 140, 144 at the side 144 of the second power transistor dies 106 attached to the respective first metal leads 108.

FIG. 4A shows the controller die 130 being aligned over an additional metal lead 132. This additional metal lead 132 and the second metal leads 110 for the half bridge assemblies can be provided as part of a leadframe strip which has a frame and interconnection structures such as tie bars for securing the leads 132 during the manufacturing process. The frame and corresponding interconnection structures (e.g. tie bars) are not shown for ease of illustration.

FIG. 4B shows the controller die 130 attached to the additional metal lead 132. Any standard die attach process such as soldering, sintering, gluing, etc. can be used to attach the controller die 130 to the additional lead 132.

FIG. 5A shows the second leadframe strip assembly with the controller die 130 being aligned over the first leadframe strip assembly with the half bridge power transistors 104, 106.

FIG. 5B shows the second metal leads attached to the top side of the respective first power transistor dies. Any standard die attach process such as soldering, sintering, gluing, etc. can be used to attach the top side of each first power transistor die to the bottom side of the corresponding second metal lead.

FIG. 5C shows a side perspective view of structure after the second metal leads 110 are attached to the top side of the respective first power transistor dies 104, prior to molding. Also prior to molding, bond wire connections are formed between the controller die 130 and the one or more bond pads 140, 144 at the side 144 of each second power transistor die 106 exposed by the notch 142 in the corresponding first metal lead 108. Any standard molding process such as injection molding, transfer molding, compression molding, etc. can then be used to embed each half bridge 102 and each metal lead 108, 110, 132 in mold compound 112.

Figure 6:
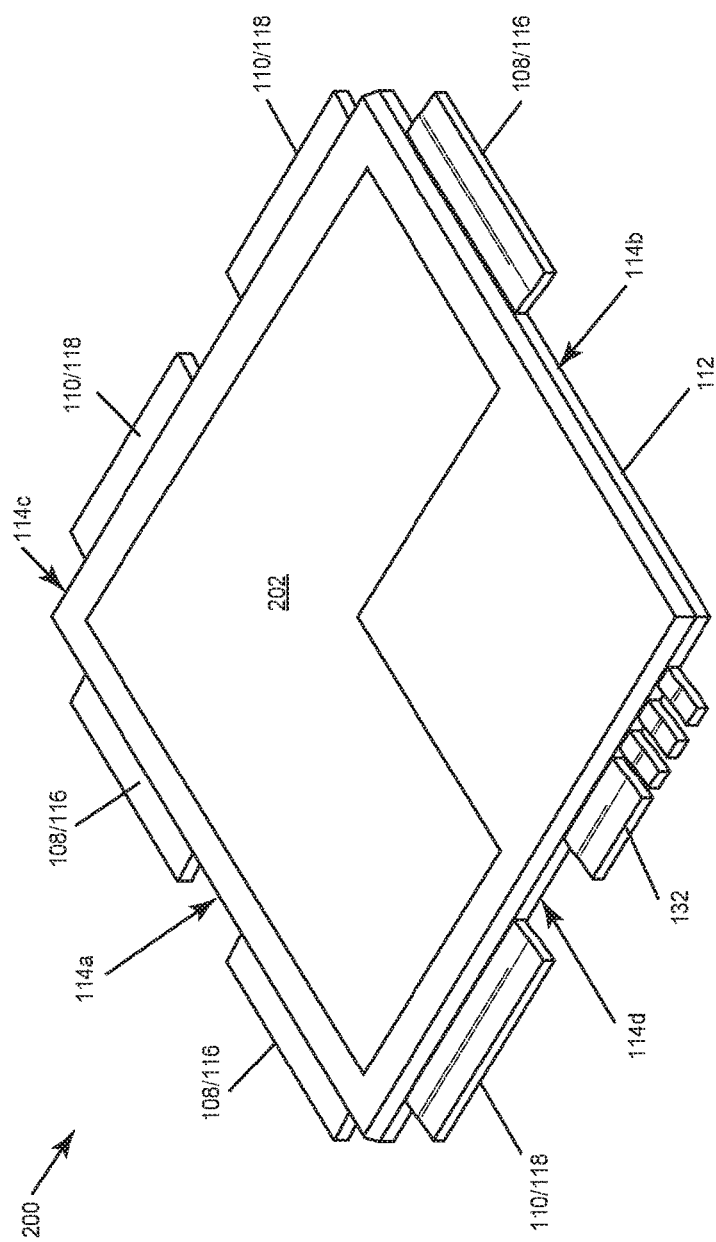
FIG. 6 illustrates a top perspective view of another embodiment of a multi-phase half bridge driver package.

FIG. 6 illustrates a top perspective view of another embodiment of a multi-phase half bridge driver package 200. The embodiment shown in FIG. 6 is similar to the embodiment shown in FIGS. 1A through 1D. Different, however, a single second metal lead 202 is attached to the top side of the first power transistor die 104 of each half bridge 102 instead of separate second metal leads 110. The single second metal lead 202 protrudes from one side face 114c of the mold compound 112 in two locations and from an opposing side face 114d of the mold compound 112 in a single location. Still other lead configurations are possible, and within the scope of the package embodiments described herein.

Figure 7A:
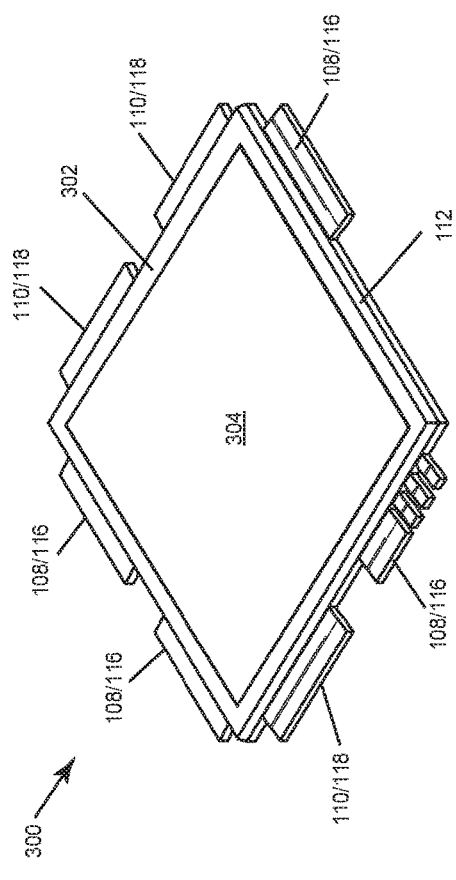
FIGS. 7A and 7B illustrate top and side perspective views, respectively, of yet another embodiment of a multi-phase half bridge driver package.
Figure 7B:
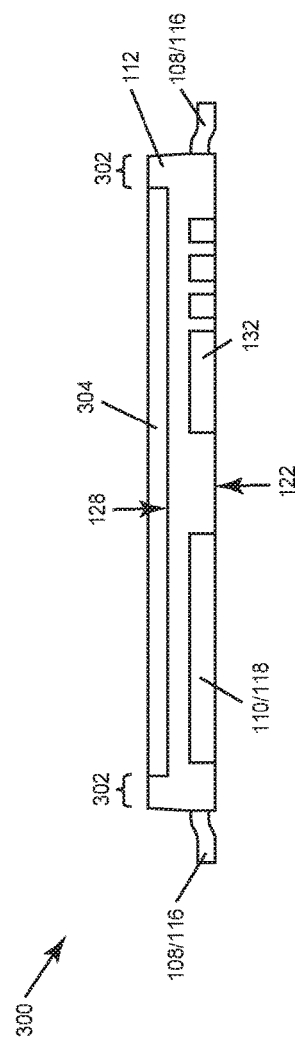

FIGS. 7A and 7B illustrate top and side perspective views, respectively, of yet another embodiment of a multi-phase half bridge driver package 300. The embodiment shown in FIGS. 7A and 7B is similar to the embodiment shown in FIGS. 1A through 1D. Different, however, the mold compound 112 includes a ridge 302 formed around a periphery of the top main face 128 of the mold compound 112. The ridge 112 can be formed as part of the molding process, or instead formed afterword by thinning the inner region of the top surface 128 of the mold compound 112. In either case, a thermally conductive and electrically insulative material 304 such as silicone or any other suitable material with high heat capacity can be disposed on the top main face 128 of the mold compound 112 and confined by the ridge 302.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
    a plurality of half bridges each comprising a first power transistor die disposed over a second power transistor die;
    a separate first metal lead attached to a bottom side of the first power transistor die and to a top side of the second power transistor die of each half bridge;
    a separate or single second metal lead attached to a top side of the first power transistor die of each half bridge; and
    a mold compound in which each half bridge and each metal lead are embedded,
    wherein each first metal lead protrudes from a side face of the mold compound to form a half bridge output terminal,
    wherein each second metal lead protrudes from a side face of the mold compound to form a first half bridge power terminal,
    wherein at least part of a bottom side of the second power transistor die of each half bridge is not covered by the mold compound at a first main face of the mold compound to form a second half bridge power terminal,
    wherein at least part of each second metal lead is not covered by the mold compound at a second main face of the mold compound opposite the first main face,
    wherein each first metal lead has a notch which exposes one or more bond pads at the top side of the second power transistor die attached to that first metal lead.

2. The semiconductor package of claim 1, wherein three half bridges are embedded in the mold compound, wherein two first metal leads protrude from a first side face of the mold compound, and wherein a single first metal lead protrudes from a second side face of the mold compound opposite the first side face.

3. The semiconductor package of claim 2, wherein the separate or single second metal lead protrudes from a third side face of the mold compound in two locations and from a fourth side face of the mold compound opposite the third side face in a single location.

4. The semiconductor package of claim 1, wherein the part of the bottom side of each second power transistor die not covered by the mold compound has bare semiconductor material exposed at the first main face of the mold compound.

5. The semiconductor package of claim 1, wherein the plurality of half bridges forms a multi-phase brushless DC motor driver.

6. The semiconductor package of claim 1, wherein the plurality of half bridges forms a multi-phase power converter driver.

7. The semiconductor package of claim 1, further comprising a controller die embedded in the mold compound and configured to control the plurality of half bridges.

8. The semiconductor package of claim 7, further comprising bond wire connections between the controller die and the one or more bond pads at the top side of each second power transistor die exposed by the notch in the corresponding first metal lead.

9. The semiconductor package of claim 1, wherein the mold compound includes a ridge formed around a periphery of the second main face of the mold compound.

10. The semiconductor package of claim 9, further comprising a thermally conductive and electrically insulative material disposed on the second main face of the mold compound and confined by the ridge.

11. A semiconductor package, comprising:
    a plurality of half bridge assemblies each comprising a metal lead, a first power transistor die attached to a first side of the metal lead, and a second power transistor die disposed under the first power transistor die and attached to a second side of the metal lead opposite the first side, each metal lead having a notch which exposes one or more bond pads at a side of the second power transistor die attached to the metal lead;
    a controller die configured to control the first power transistor dies and the second power transistor dies;
    a mold compound in which each power transistor die, each metal lead and the controller die are embedded; and
    bond wire connections between the controller die and the one or more bond pads at the side of each second power transistor die exposed by the notch in the corresponding metal lead.

12. The semiconductor package of claim 11, wherein at least part of each second power transistor die is not covered by the mold compound at a first main face of the mold compound so that bare semiconductor material is exposed at the first main face of the mold compound.

13. A semiconductor package, comprising:
    a plurality of half bridges each comprising a first power transistor die disposed over a second power transistor die;
    a separate first metal lead attached to a bottom side of the first power transistor die and to a top side of the second power transistor die of each half bridge;
    a separate or single second metal lead attached to a top side of the first power transistor die of each half bridge; and
    a mold compound in which each half bridge and each metal lead are embedded,
    wherein each first metal lead protrudes from a side face of the mold compound to form a half bridge output terminal,
    wherein each second metal lead protrudes from a side face of the mold compound to form a first half bridge power terminal,
    wherein at least part of a bottom side of the second power transistor die of each half bridge is not covered by the mold compound at a first main face of the mold compound to form a second half bridge power terminal,
    wherein at least part of each second metal lead is not covered by the mold compound at a second main face of the mold compound opposite the first main face, wherein the part of the bottom side of each second power transistor die not covered by the mold compound has bare semiconductor material exposed at the first main face of the mold compound.

\* \* \* \* \*